United States Patent [19]
Gearhardt et al.

[11] Patent Number: 5,701,309
[45] Date of Patent: Dec. 23, 1997

[54] AUTOMATED TEST EQUIPMENT DIGITAL TESTER EXPANSION APPARATUS

[75] Inventors: Kevin J. Gearhardt, Fort Collins; Darrell L. Pruehsner, Bellvue, both of Colo.

[73] Assignees: AT&T Global Information Solutions Company, Dayton, Ohio; Hyundai Electronics America, San Jose, Calif.; Symbios Logic Inc., Fort Collins, Colo.

[21] Appl. No.: 984,645

[22] Filed: Dec. 2, 1992

[51] Int. Cl.$^6$ .................................................. G01R 31/28
[52] U.S. Cl. .......................................... 371/25.1; 371/22.3
[58] Field of Search ........................... 371/22.3, 15.1, 371/20.4, 27, 22.1, 16.1, 25.1; 395/183.01, 183.06

[56] References Cited

U.S. PATENT DOCUMENTS

| | | | |
|---|---|---|---|
| 4,519,078 | 5/1985 | Komonytsky | 371/25.1 |
| 4,553,090 | 11/1985 | Hatano et al. | |
| 4,597,042 | 6/1986 | D'Angeac et al. | 371/25.1 |
| 4,597,080 | 6/1986 | Thatte et al. | 371/25.1 |
| 4,658,400 | 4/1987 | Brown et al. | 371/25.1 |
| 4,791,357 | 12/1988 | Hyduke | 371/25 |
| 4,894,829 | 1/1990 | Monie et al. | 371/16.1 |
| 4,996,691 | 2/1991 | Wilcox et al. | 371/25.1 |
| 5,001,714 | 3/1991 | Stark et al. | 371/22.1 |
| 5,032,783 | 7/1991 | Hwang et al. | 371/25.1 |
| 5,132,635 | 7/1992 | Kennedy | 371/15.1 |
| 5,164,663 | 11/1992 | Alcorn | |

OTHER PUBLICATIONS

Louis Y. Ungar 'Built–In Test IC Provides Automatic Test Equipment Capabilities'.

Lavng. Terng (L.T.) Wang. A Boundary–Scan Test and Diagnosis System IEEE Feb. 1992.

Primary Examiner—Robert W. Beausoliel, Jr.
Assistant Examiner—Albert Decady
Attorney, Agent, or Firm—Wayne P. Bailey; Douglas S. Foote

[57] ABSTRACT

A scan-based logic test apparatus is provided for use with an automated test equipment (ATE) digital tester which tests scan-based logic IC devices. The test apparatus is embodied in a test card which is pluggable into a bus slot within a computer. The computer includes a permanent memory for storing scan-based pattern data including serial input pattern data and expected serial output pattern data. The test card includes an I/O interface control which interfaces the test card to the computer to permit retrieval of the scan-based pattern data from the permanent memory and which interfaces the test card to the digital tester to permit the tester to supply control signals to the test card. The test card further includes an SRAM memory which is coupled to the I/O interface control. The SRAM memory stores the scan-based pattern data including serial input pattern data and expected serial output pattern data upon retrieval thereof from the permanent memory by the I/O interface control. The test card also includes an IC device interface for coupling the IC device to the SRAM memory and the I/O interface control, such that the serial input pattern data is provided to the IC device and an responsive serial output pattern data is collected from the IC device. The responsive serial output pattern data is compared with the expected serial output pattern data to make a pass/fail decision with respect to the particular IC device under test.

22 Claims, 3 Drawing Sheets

AUTOMATED TEST EQUIPMENT DIGITAL TESTER EXPANSION APPARATUS

BACKGROUND OF THE INVENTION

The present invention relates in general to automated test equipment (ATE) and, more particularly, to an apparatus for expanding the capabilities and capacities of such automated test equipment.

As integrated circuits have become larger and more complex, they have concurrently become more difficult to test. Many modern large scale integration (LSI) and very large scale integration (VLSI) integrated circuits (IC's) now include such a high number of densely packed semiconductor devices that it is no longer possible to completely test such IC's by observing the normal operating behavior of an IC or associated circuits coupled thereto.

Even though such IC's have become extremely densely packed, the need continues for extensively testing these devices to assure quality control in a very competitive marketplace. One approach to this very significant testing problem has been the advent of so-called "boundary scan test procedures" as implemented on automated test equipment. IEEE Standard 1149.1 describes such a boundary scan test procedure for one or more IC's which include a multiplicity of elements or components so arranged that individual components within the IC's can not be evaluated by observing the normal operation of the IC or interconnected circuits.

In boundary scan testing, the pins or external terminals of an integrated circuit or several integrated circuits are interconnected to form a shift register chain around the border of the circuit design. The interconnected path is provided with serial input and output connections and appropriate clock and control signals. Using this interconnected path, test instructions and associated test data can be fed into the IC or interconnected circuits. The results of the execution of the instructions are read out of each of the circuits also via the interconnected path. If all of the components used in constructing a circuit have a boundary scan register, test data can be shifted into all of the boundary scan register cells associated with the component output pins and loaded in parallel through the component interconnections into those cells associated with input pins.

The boundary scan register can be used as a means of isolating on-chip system logic from stimuli received from surrounding components while an internal serf-test is performed. If the boundary scan register is suitably designed, a limited slow speed static test of the on-chip system logic can be initiated since the boundary scan procedure allows delivery of test data to the component and examination of the test results.

Boundary scan testing allows detection of many of the faults that in-circuit testers currently address but without the need for extensive connection to every component or terminal of an IC. Such testing is very desirable especially for VLSI circuits since the number of components may reach very high numbers and the number of output pins of any particular IC may be so large as to practically prohibit testing of each function of the circuit.

Boundary scan implementations such as those shown in the aforementioned IEEE Standard 1149.1 include a multiplexer circuit which allows the IC to select either a boundary scan input signal or the conventional data signal which is supplied to the IC from the normal data source. In this manner, an IC equipped for boundary scan may be used in either a test mode or a normal operative mode.

Digital testers which are referred to generically as automated test equipment (ATE) actually perform the IC testing described above. It will be appreciated that in order for such ATE to perform scan-based testing of an IC, the IC or device under test (DUT) must of course be a scan-based logic design specifically designed to permit such testing as per the IEEE 1149.1 standard or other custom-designed scan logic implementation. Such an IC (or DUT) is depicted being tested by an ATE device in FIG. 1.

Conventional ATE digital testers which employ boundary scanning typically generate a test pattern which is used as input data to the test IC. This test pattern is used to set the flip-flops which form the shift register chain around the boundary of the IC to known states. The IC is then exercised and the results are provided as output test data which is compared with expected test data representing the expected results. If the actual output test data does not match the expected test data, then the IC fails the test. While scan-based logic design yields very high levels of fault coverage, it is concurrently extremely pattern intensive. Typical pattern sizes can be from several hundred thousand serial test vectors to several million test vectors.

While boundary scan testing techniques have been discussed above, IEEE 1149.1 also provides for internal scanning of an IC by an ATE tester. That is, either a full internal scan or a partial internal scan can be conducted on an IC to exercise and test the components therein. As before, a test pattern consisting of a set of 1's and 0's is generated which is applied as serial data to the IC under test. The 1's and 0's coming out of the IC under test form serial output data which is compared with expected results and used to make a pass/fail determination for the IC device under test. The term "vector" is used to mean one line or cycle of an input test pattern, A vector contains a sufficient number of bits to provide a test signal to each of the signal pins of a particular device under test. A test pattern consists of a large number of vectors which taken together form a serial data set which fully exercises the internal components of the device under test.

ATE test memory, which is also referred to as "pattern memory", is often relatively small. ATE pattern memory is located inside the tester and is typically within the range of between 512K and 1M in depth. It is often difficult for ATE digital testers equipped in this manner to handle the large serial vectors and test patterns required by full or partial internal testing of LSI and VLSI IC's. It has been found that ATE digital testers which are physically equipped with two test heads to receive two chips at a time for testing often can not simultaneously test two LSI and VLSI chips due the aforementioned memory limitations of the ATE tester.

SUMMARY OF THE INVENTION

Accordingly, one object of the present invention is to provide an ATE digital tester with expanded memory capability.

Another object of the present invention is to provide an ATE digital tester with the capability of testing two LSI or VLSI IC's simultaneously.

Yet another object of the present invention is to provide an apparatus for adapting a conventional personal computer to provide additional testing capabilities to an ATE digital tester.

In accordance with one embodiment of the present invention, a scan-based logic test apparatus is provided for use with an automated test equipment (ATE) digital tester which tests scan-based logic IC devices. The test apparatus is pluggable into a bus slot within a computer including a first permanent memory. The test apparatus includes a coupler for coupling the apparatus to the computer to permit access to scan-based pattern data stored in the first permanent memory of the computer. The scan-based pattern data includes serial input pattern data and expected serial output pattern data. The test apparatus further includes an I/O interface control circuit which is coupled to the coupler for interfacing the apparatus to the computer to permit retrieval of the scan-based pattern data from the first permanent memory and for interfacing the apparatus to the digital tester to permit the tester to supply control signals to the apparatus. The test apparatus also includes an SRAM memory, coupled to the I/O interface control circuit, for storing the scan-based pattern data including serial input pattern data and expected serial output pattern data from the first permanent memory upon retrieval thereof by the I/O interface control circuit. The test apparatus further includes an IC device interface for coupling the IC device to the SRAM memory and the I/O interface control circuit, such that the serial input pattern data is provided to the IC device and actual serial output pattern data is collected from the IC device for comparison with the expected serial output pattern data to make a pass/fail decision with respect to the IC device.

In another embodiment of the invention, a scan-based logic test system is provided for testing scan-based logic IC devices. The test system includes a computer having a bus slot for receiving an adapter card therein. The computer further includes a first permanent memory for storing scan-based pattern data including serial input pattern data and expected serial output pattern dan. The test system also includes an ATE digital tester having a second permanent memory. The test system further includes a scan-based logic test card situated in the bus slot. The test card includes an I/O interface control circuit, coupled to the bus slot and the digital tester, for interfacing the card to the computer to permit retrieval of the scan-based pattern data from the first permanent memory and for interfacing the apparatus to the digital tester to permit the tester to supply control signals to the apparatus. The test card also includes an SRAM memory, coupled to the I/O interface control circuit, for storing the scan-based pattern data including serial input pattern data and expected serial output pattern data from the first permanent memory upon retrieval thereof by the I/O interface control circuit. The test card still further includes an IC device interface circuit for coupling an IC device to the SRAM memory and the I/O interface control circuit, such that the serial input pattern data is provided to the IC device and actual serial output pattern data is collected from the IC device for comparison with the expected serial output pattern data to make a pass/fail decision with respect to the IC device.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION OF THE INVENTION

I. General Block Diagram Description

Figure 1:
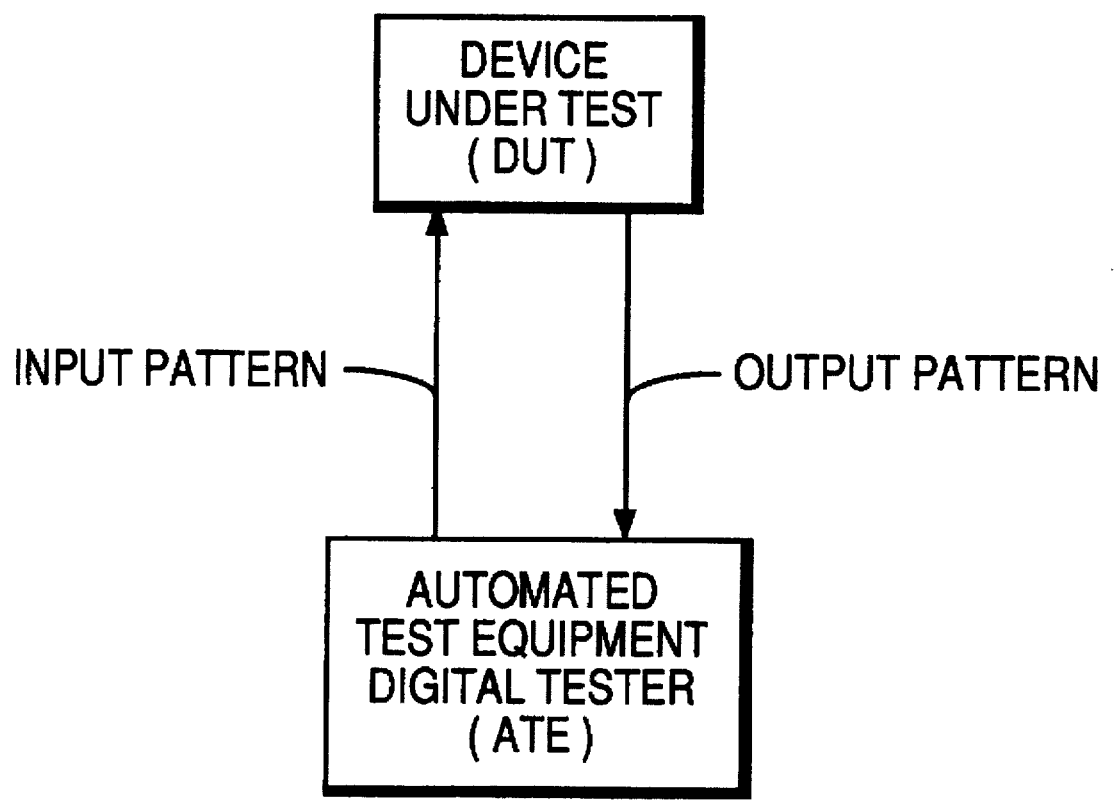
FIG. 1 is a block diagram of a conventional automated test equipment digital tester shown coupled to a device under test.
Figure 2:
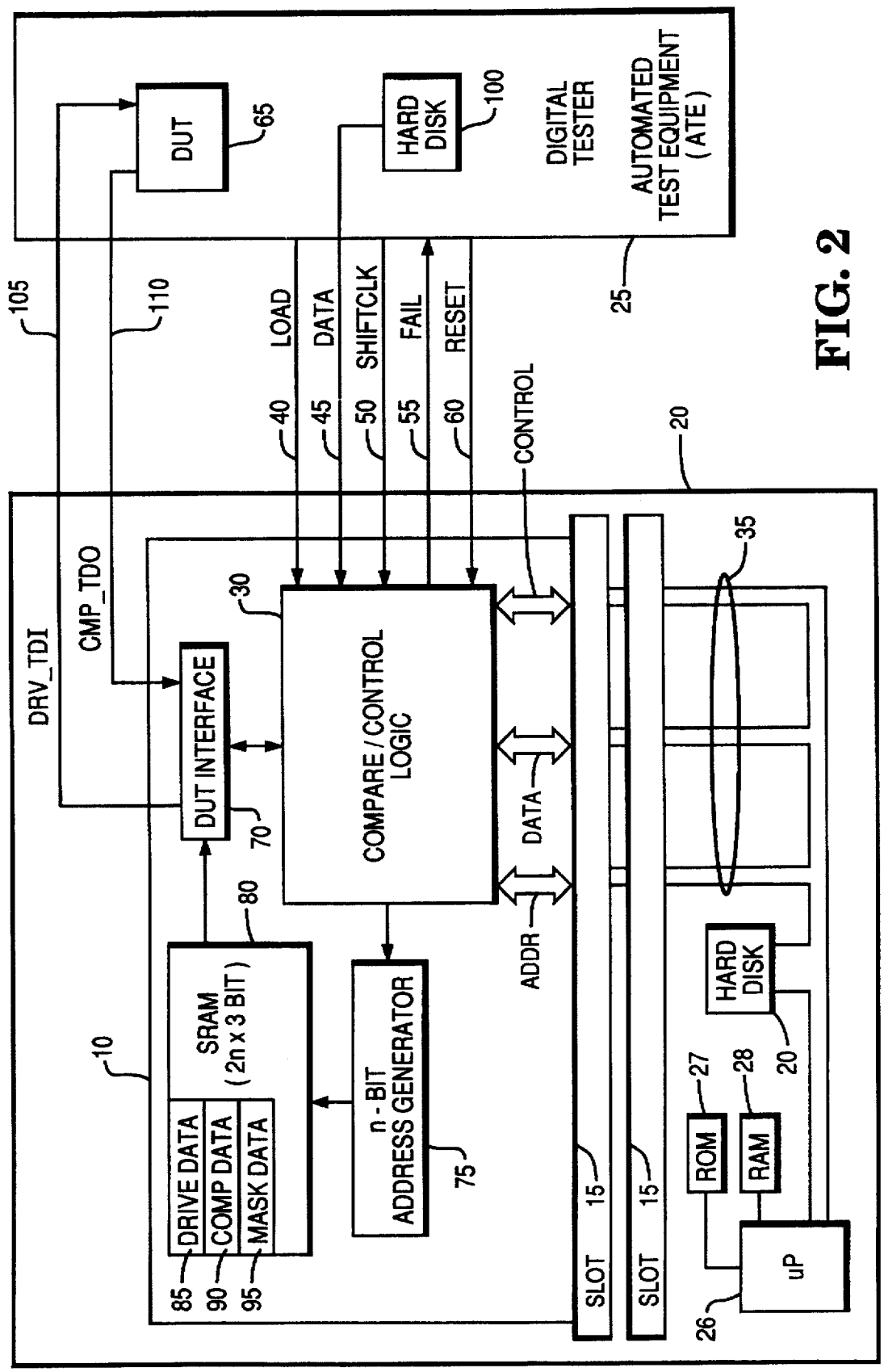
FIG. 2 is a block diagram of a scan test apparatus in accordance with the present invention.

FIG. 2 depicts a scan test apparatus in accordance with the present invention as apparatus 10. Scan test apparatus 10 is plugged into a slot 15 in a conventional personal computer 20 to expand the testing capabilities of a conventional ATE digital tester 25 which is also coupled to scan test apparatus 10. In the preferred embodiment of the invention, apparatus 10 is plugged into a slot 15 which is an Industry Standard Architecture (ISA) bus slot. Those skilled in the art, however, will appreciate that the invention is readily adapted for use in computers with Extended Industry Standard Architecture (EISA), MICRO CHANNEL architecture as well as other bus architectures. (MICRO CHANNEL is a trademark of the IBM Corporation.) Computer 20 includes a microprocessor 26, a read only memory (ROM) 27 for storing computer microcode, a main system memory RAM 28, and a hard disk 29.

Scan test apparatus 10 includes compare/control logic 30 which interfaces apparatus 10 to a computer bus 35 which is coupled to slots 15. Compare/control logic 30 employs conventional, standard ISA input/output (I/O) operations to perform computer operations between apparatus 10 and personal computer 20.

Scan test apparatus 10 is coupled to an ATE digital tester 25 which is capable of testing scan-based logic designed IC devices. More specifically, compare/control logic 30 of apparatus 10 is coupled to digital tester 25 by LOAD line 40, DATA line 45, SHIFTCLK line 50, FAIL line 55 and RESET line 60. The actual operation and function of these lines will be discussed later in more detail.

Scan test apparatus 10 is coupled to a device under test (DUT) 65 by a DUT interface 70. DUT 65 is the actual device under test, namely, one or two LSI or VLSI integrated circuits, for example.

Compare/control logic 30 is coupled to an n-bit address generator 75, the output of which is coupled to an input of SRAM (static RAM) memory 80. In one embodiment of the invention, SRAM memory 80 employs a 2n×3 bit high speed SRAM memory wherein n is defined as being between approximately 20 and approximately 32 for address spaces between approximately 1 Mbyte and approximately 4 Gbytes. SRAM memory 80 includes a DRIVE DATA block 85, a COMP DATA block 90 and a MASK DATA block 95. The output of SRAM 80 is coupled to an input of DUT interface 70. In this particular embodiment, a 1M SRAM is employed as SRAM 80, although a larger SRAM could also be employed for additional memory expansion.

Scan test apparatus 10 provides an extension or expansion to the normal test pattern memory which is situated within conventional ATE digital testers. As mentioned early, the usual 512K to 1M of memory typically included in digital testers such as digital tester 25 is often inadequate for very pattern intensive test purposes. Scan test apparatus 10 works in tandem with digital tester 25 to provide tester 10 with essentially unlimited amounts of serial test memory to be used for scan test implementations.

II. General Operation

Scan test apparatus 10 accepts serial scan test vectors from commercially available ATPG software tools, such as Intelligen, as well as customer-designed ATPG software tools. These scan test vectors are then split up into normal ATE test vectors and PC-based serial test vectors. The ATE test vectors are distinguishable from the PC-based serial test vectors in that the ATE test vectors are parallel control vectors. The PC-based serial test vectors are permanently stored on hard disk 29 for later use when DUT 65 is actually being tested. The ATE test vectors are stored in a hard disk 100 coupled to DATA line 45 in ATE digital tester 25. Hard disk 100 provides a permanent memory for these ATE test vectors.

Whenever a particular DUT IC 65 is to be tested, a load utility program is used to store the PC-based test vectors in SRAM 80. These PC-based test vectors include serial input data (such as data for JTAG-TDI) and serial output data (such as for JTAG-TDO). The term JTAG refers to Joint Test Action Group, a testing standards organization which defined the scan-based logic test standards set forth in detail in IEEE 1149.1. JTAG-TDI refers to JTAG-Test Data Input and JTAG-TDO refers to JTAG Test Data Output. This serial output data include compare and mask data to permit non-deterministic scan chains to be accommodated. This mandates the 3 bit wide SRAM block used for one scan chain in SRAM 80. If it is desired for the ATE to handle two scan chains, SRAM block 80 is configurable into two 3 bit wide SRAM blocks. SRAM 80 is controlled by computer 20 via compare/control logic 30 while the serial input test pattern is being loaded from hard disk 29 to SRAM 80. However, during the actual test of DUT 65, SRAM 80 is controlled by n-bit address generator 75. That is, in response to the SHIFTCLK clock and RESET control signals from tester 25, compare/control logic instructs address generator 75 to provide addresses of the serial test pattern data stored in SRAM 80 in the bit sequence by which such serial test pattern data is to be read out of SRAM 80 and be provided to DUT 65.

ATE digital tester 25 provides the control signals needed to reset and clock the n-bit address generator 75. More specifically, tester 25 provides a reset signal over RESET line 60 and further provides a clocking signal over SHIFT-CLK line 50 to control the transfer of a serial test pattern from hard disk 29 to SRAM 80 and then from SRAM 80 to DUT 65.

Scan test apparatus 10 provides the appropriate serial input data (serial test pattern) from SRAM 80 to DUT 65 through DUT interface block 70. The serial input data is actually provided to DUT 65 over DRV_DI line 105 as shown. In response to the serial input data, DUT 65 generates serial output data which is provided to DUT interface 70 over CMP_TDO line 110. Scan test apparatus 10 also provides expected serial compare data from hard disk 29 to compare/control logic 30. Compare/control logic 30 then compares the serial output data received from DUT 65 (in response to the serial input data) with the expected serial compare data and makes a pass/fail determination with respect to the particular DUT 65. The results of the comparison of the PC based expected serial compare data with the actual DUT serial output data yield a pass/fail signal on FAIL line 55. ATE tester 25 then strobes FAIL line 55 with the ATE test vectors to make the actual DUT pass/fail decision.

Since scan test apparatus 10 is loaded with the large serial test vectors which the small memory in production ATE digital tester 25 would otherwise have to attempt to handle, ATE tester 25 is relieved of that task. The production ATE tester 25 need only host control vectors to provide reset, clock and fail analysis to and from scan test apparatus 10. In this manner, the analysis capabilities of ATE tester 25 are significantly expanded by permitting the accommodation of significantly larger test vectors and serial test patterns than before possible.

III. Detailed Operation And Flowchart

One type of ATE digital tester with which scan test apparatus 10 may be employed is the LTX-Trillium digital tester manufactured by Trillium, Inc. Apparatus 10 may however be used in conjunction with testers other than this particular tester which is mentioned here only for purposes of example.

Before discussing the detailed operation of scan test apparatus 10, it is reiterated that input DRV_TDI 105 is the input to DUT 65 which provides the serial input scan test pattern to DUT 65 and that output CMP_TDO 110 is the output from DUT 65 at which the serial output pattern appears in response thereto. In other words, CMP_TDO 110 is the scan chain output of the scan logic designed DUT 65.

Figure 3:
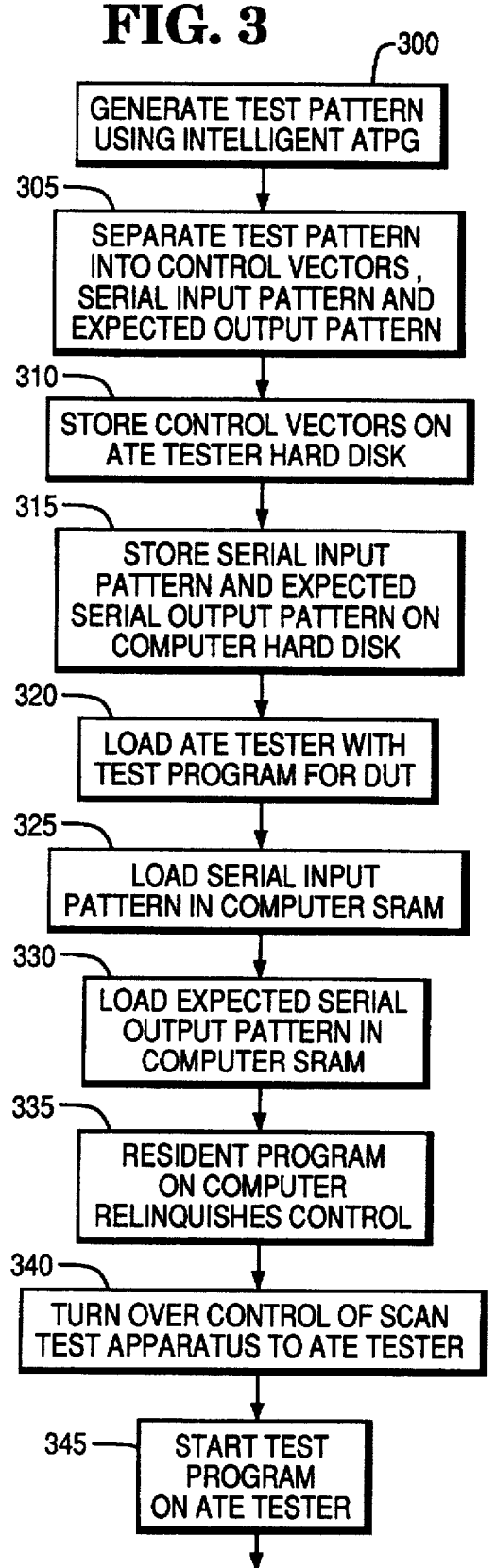
FIG. 3 is a flowchart which depicts the operational flow of the scan test apparatus of FIG. 2 in conjunction with an ATE digital tester and a conventional personal computer.
Figure 3:
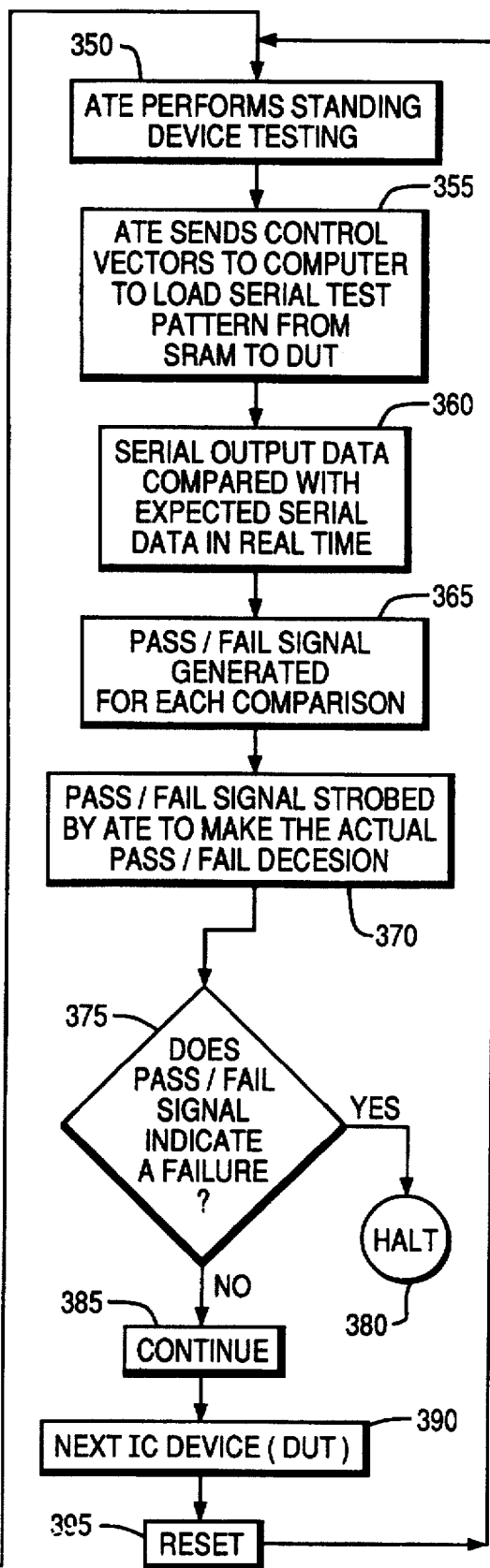

FIG. 3 is a flowchart which depicts the step by step operational flow of scan test apparatus 10 as it operates in conjunction with a standard or custom-built ATE digital tester 25 to test DUT 65. As part of preliminary set-up activity, a test pattern specific to the particular IC device under test, DUT 65, is generated using a conventional intelligent automated test pattern generator (ATPG) tool as per block 300. The test pattern is then separated in block 305 into control vectors, the serial input pattern which will be provided to DUT 65 and the expected serial output pattern which is expected in response from DUT 65. A computer running the appropriate computer aided design (CAD) test software actually performs this separation. As per block 310, the control vectors are permanently stored on hard disk 100 in ATE digital tester 25. The serial input pattern and the expected resultant serial output pattern are stored permanently on hard disk 29 in computer 20 as per block 315. The pattern data which is stored in hard disk 29 includes drive data included in the serial input data and further includes compare data and mask data stored in the expected serial output data.

ATE digital tester 25 is then loaded with the particular test program for the IC device under test, DUT 65 as per block 320. Resident software on computer 20 then loads the serial input pattern data and the serial output pattern data which are stored on hard disk 29 into SRAM 80 as per blocks 325 and 330, respectively. It is noted that when serial input and output pattern data are retrieved from hard disk 29 and sent to SRAM 80 for storage, standard ISA compatible I/O read/write operations are implemented within compare/control logic 30 to achieve this data transfer. At this point in the test sequence wherein SRAM 80 has been loaded with the serial input pattern and the expected serial output pattern, the aforementioned resident program on computer 20 relinquishes control as per block 335 and control is turned over from scan test apparatus 10 to ATE digital tester 25 as per block 340.

The user then starts the test program on ATE digital tester 25 as per block 345. At this point, ATE digital tester 25 performs standard device testing on DUT 65 as per block 350. Such standard device testing typically consists of continuity testing, functional testing, speed testing, DC parametric testing and the like. It is noted that scan-based testing of DUT 65 has not yet commenced.

Having finished standard testing in block 350, ATE digital tester 25 then sends control vectors to computer 20 and scan test apparatus 10 to cause the serial input test pattern stored in SRAM 80 to be loaded into DUT 65 as per block 355. Tester 25 sends clocking and reset signals to scan test apparatus 10 over SHIFTCLK line 50 and RESET line 60. This action causes the serial input data pattern stored in SRAM 80 to be serially clocked into DUT 65 at the clock rate of the SHIFTCLK clocking signal.

More specifically, tester 25 controls the operation of scan test apparatus 10 through the LOAD, DATA, SHIFTCLK and RESET lines. When LOAD line 40 is active high, data from DATA line 45 is serially shifted from tester 25 into scan test apparatus 10 with the SHIFTCLK line 50. This serial data provided by tester 25 to scan test apparatus 10 forms the internal SRAM addresses for scan test apparatus 10, namely the addresses of the serial input pattern data stored in SRAM 80 and which is to be provided to DUT 65. When LOAD line 40 goes active low, the serial address data from tester 25 is latched into address generator 75. The serial data then appears on the address lines to SRAM 80 to cause SRAM 80 to supply DUT 65 with the desired serial input test pattern.

During testing of DUT 65, the standard ATE digital tester parallel patterns control the parallel DUT pins (not shown as this is standard). Tester 25 controls SHIFTCLK line 50 to send the serial input test pattern from SRAM 80 into the DRV_TDI input line 105 of DUT 65. Serial scan output data from DUT 65 is sent back from DUT 65 over CMP_TDO line 110 to scan test apparatus 10 for comparison against the expected serial output pattern stored in SRAM 80. The actual serial output pattern data from DUT 65 is compared with the expected serial output pattern data in real time as per block 360. As a result of this comparison which is conducted by compare/control logic 30, a pass/fail signal is generated on FAIL line 55 as per block 365.

The FAIL line 55 of apparatus 10 is constantly strobed by digital tester 25 to monitor the pass/fail status of DUT 65 so that, as per block 370, digital tester 25 can make the actual pass/fail decision with respect to particular DUT 65. Serial data masking is handled within test scan apparatus 10 such that ATE digital tester 25 parallel patterns can constantly strobe. Digital tester 25 makes a determination of whether or not a fail signal appears on FAIL line 55 as per decision block 375. If a failure is indicated on FAIL line 55, testing by digital tester 25 halts as indicated at block 380. If a failure is not found at block 375, testing continues as per block 385. When ATE tester 25 issues a RESET signal on RESET line 60 (presumably when new DUT's 65 have been connected to scan test apparatus 10 for testing), the process begins all over again. In other words, when a new DUT 65 is connected to scan test apparatus 10 for testing as per block 390, ATE digital tester 25 issues a RESET signal on RESET line 60 as per block 395. Scan test apparatus 10 is reset such that flow continues back to block 350 at which ATE digital tester 25 commences another test sequence as shown in FIG. 3.

While the above description sets forth a scan-based IC test apparatus and test system, it is clear that the foregoing disclosure also sets forth a method of providing additional pattern memory to an automated test equipment (ATE) digital tester which tests scan-based logic IC devices. That method includes the step of providing a computer including a first permanent memory and a scan-based logic test card installed therein. The test card includes an SRAM pattern memory for storing scan-based patterns therein. The test card is coupled to a scan-based logic IC device. The method further includes the step of storing serial input pattern data and expected serial output pattern data in the first permanent memory in the computer. The method also includes the step of storing control vectors in a second permanent memory in the digital tester for initiating and controlling the transfer of serial input pattern data by the card to the IC device. The method still further includes the step of transferring the serial input pattern data and the expected serial output pattern data in the first permanent memory to the SRAM pattern memory. The method also includes the step of the card inputting the serial input pattern data from the SRAM memory to the IC device in response to control vectors from the ATE digital tester. The method further includes the steps of the card receiving responsive serial output data from the IC device in response to the serial input pattern data, and comparing the responsive serial output pattern data to the expected serial output pattern data to make a pass/fail decision with respect to the IC device.

The foregoing has described a test apparatus for use with an ATE digital tester to provide expanded memory capability thereto. Moreover, a test apparatus is provided which adapts a conventional personal computer to provide additional testing capabilities to an existing ATE digital tester.

While only certain preferred features of the invention have been shown by way of illustration, many modifications and changes will occur to those skilled in the art. It is, therefore, to be understood that the present claims are intended to cover all such modifications and changes which fall within the true spirit of the invention.

What is claimed is:

1. A scan-based logic test apparatus for use with an automated test equipment (ATE) digital tester which tests scan-based logic IC devices, said test apparatus being pluggable into a bus slot within a computer including a first permanent memory, said test apparatus comprising:

coupling means for coupling said apparatus to said computer to permit access to scan-based pattern data stored in the first permanent memory of said computer, said scan-based pattern data including serial input pattern data and expected serial output pattern data;

I/O interface control means, coupled to said coupling means, for interfacing said apparatus to said computer to permit retrieval of said scan-based pattern data from said first permanent memory and for interfacing said apparatus to said digital tester to permit said tester to supply control signals to said apparatus;

an SRAM memory, coupled to said I/O interface control means, for storing said scan-based pattern data including serial input pattern data and expected serial output pattern data from said first permanent memory upon retrieval thereof by said I/O interface control means, and an IC device interface means for coupling said IC device to said SRAM memory and said I/O interface control means, such that said serial input pattern data is provided to said IC device and actual serial output pattern data is collected from said IC device for comparison with said expected serial output pattern data to make a pass/fail decision with respect to said IC device.

2. The scan-based logic test apparatus of claim 1 further comprising a DATA line coupled between said digital tester and said apparatus for permitting said apparatus to receive control vectors stored in a second permanent memory situated in said digital tester.

3. The scan-based logic test apparatus of claim 1 including a FAIL line at which a FAIL signal is provided by said apparatus to inform said digital tester when said comparison indicates failure of said IC device.

4. A scan-based logic test system for testing scan-based logic IC devices comprising:

a computer including a bus slot for receiving an adapter card therein, said computer further including a first permanent memory for storing scan-based pattern data including serial input pattern data and expected serial output pattern data;

an ATE digital tester including a second permanent memory;

a scan-based logic test card situated in said bus slot, said test card including:
- I/O interface control means, coupled to said bus slot and said digital tester, for interfacing said card to said computer to permit retrieval of said scan-based pattern data from said first permanent memory and for interfacing said apparatus to said digital tester to permit said tester to supply control signals to said apparatus;
- an SRAM memory, coupled to said I/O interface control means, for storing said scan-based pattern data including serial input pattern data and expected serial output pattern data from said first permanent memory upon retrieval thereof by said I/O interface control means, and
- an IC device interface means for coupling an IC device to said SRAM memory and said I/O interface control means, such that said serial input pattern data is provided to said IC device and actual serial output pattern data is collected from said IC device for comparison with said expected serial output pattern data to make a pass/fail decision with respect to said IC device.

5. The scan-based logic test system of claim 4 wherein said second permanent memory in said digital tester stores control vectors for controlling the testing of IC devices by said scan-based logic test card.

6. The scan-based logic test system of claim 4 wherein said first permanent memory comprises a hard disk drive.

7. The scan-based logic test system of claim 4 wherein said second permanent memory comprises a hard disk drive.

8. The scan-based logic test system of claim 4 wherein said computer comprises an ISA compatible bus architecture computer.

9. A method of providing additional pattern memory to an automated test equipment (ATE) digital tester which tests scan-based logic IC devices, said method comprising the steps of:
- providing a computer including a first permanent memory and a scan-based logic card installed therein, said card including an SRAM pattern memory for storing scan-based patterns therein, said card being couplable to said scan-based logic IC device;
- storing serial input pattern data and expected serial output pattern data in the first permanent memory in said computer;
- storing control vectors in a second permanent memory in said digital tester for initiating and controlling the transfer of serial input pattern data by said card to said IC device;
- transferring said serial input pattern data and said expected serial output pattern data in said first permanent memory to said SRAM pattern memory;
- said card inputting the serial input pattern data from said SRAM memory to said IC device in response to said control vectors from said ATE digital tester;
- said card receiving responsive serial output data from said IC device in response to said serial input pattern data, and
- comparing said responsive serial output data to said expected serial output pattern data to make a pass/fail decision with respect to said IC device.

10. The method of claim 9 further comprising the step of generating a test pattern for said IC logic device, said test pattern including said control vectors, said serial input pattern data and expected serial output pattern data.

11. The method of claim 10 further comprising the step of separating said control vectors from said serial input pattern data and said expected serial output pattern data.

12. The method of claim 9 wherein the computer provided in said providing a computer step is an ISA compatible bus architecture computer.

13. The method of claim 9 wherein the first permanent memory provided in said providing a computer step is a hard disk drive.

14. The method of claim 9 wherein the second permanent memory provided in said storing said control vectors step is a hard disk drive.

15. A method of providing additional pattern memory to an automated test equipment (ATE) digital tester which tests scan-based logic IC devices, said method comprising the steps of:
- providing a computer including a first permanent memory and a scan-based logic card installed therein, said card including SRAM pattern memory for storing scan-based patterns therein, said card being couplable to said scan-based logic IC device for which testing by said ATE digital tester is desired;
- generating a test pattern for said IC logic device, said test pattern including control vectors, serial input pattern data and expected serial output pattern data;
- separating said control vectors from said serial input pattern data and said expected serial output pattern data;
- storing said control vectors in a second permanent memory in said digital tester;
- storing said serial input pattern data and said expected serial output pattern data in the first permanent memory in said card;
- transferring said serial input pattern data and said expected serial output pattern data in said first permanent memory to said SRAM pattern memory;
- said card inputting the serial input pattern data from said SRAM memory to said IC device in response to said control vectors from said ATE digital tester;
- said card receiving responsive serial output data from said IC device in response to said serial input pattern data, and
- comparing said responsive serial output data to said expected serial output pattern data to make a pass/fail decision with respect to said IC device.

16. The method of claim 15 wherein the computer provided in said providing a computer step is an ISA compatible bus architecture computer.

17. The method of claim 15 wherein the first permanent memory provided in said providing a computer step is a hard disk drive.

18. The method of claim 15 wherein the second permanent memory provided in said storing said control vectors step is a hard disk drive.

19. A system for testing a scan-based logic integrated circuit device comprising;
- a digital tester having a connector for connecting signal lines to at least some external terminals of a device to be tested, and including means for storing control vectors;
- a scan test apparatus coupled to said digital tester and to at least one external terminal of said device to be tested, said test apparatus including means for storing scan test vectors; and
- means operable in said digital tester for enabling said scan test apparatus to download said scan test vectors into said device.

20. The system of claim 19 and including means in said scan test apparatus for comparing a data pattern generated by said device in response to said scan test vectors to an ideal data pattern and for producing output data indicative of the correlation therebetween.

21. The system of claim 20 and including means in said digital tester responsive to said output data for providing one of a pass and fail indication of said device.

22. A method for testing a scan-based integrated circuit device on an automated tester comprising the steps of:

separating the test signals into control signals and preselected data signals;

storing the data signals in a computer separate from the tester;

coupling the tester to the computer via a data link for transferring command signals from the tester to the computer and for transferring data signals between the computer and the tester;

connecting a device to be tested to the tester;

generating control signals in the tester to place the device in a test mode;

transferring the stored data signals from the computer through the data link to the device;

transferring output signals generated by the device in response to the data signals from the device to the computer via the data link;

comparing the output signals in the computer to predetermined ideal output signals; and providing status signals to the tester from the computer in response to the step of comparing.

\* \* \* \* \*

UNITED STATES PATENT AND TRADEMARK OFFICE
CERTIFICATE OF CORRECTION

PATENT NO. : 5,701,309
DATED : December 23, 1997
INVENTOR(S) : Gearhardt et al.

It is certified that error appears in the above-indentified patent and that said Letters Patent is hereby corrected as shown below:

Column 10, line 63, after "said" insert --scan--.

Signed and Sealed this

Eighth Day of September, 1998

Attest:

BRUCE LEHMAN

Attesting Officer            Commissioner of Patents and Trademarks